(12) United States Patent
Bertolami

(10) Patent No.: US 6,309,037 B2
(45) Date of Patent: *Oct. 30, 2001

(54) PCI I/O BRACKET RETAINER

(75) Inventor: Gwen M. Bertolami, Menlo Park, CA (US)

(73) Assignee: Hewlett-Packard Company, Palo Alto, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/302,715

(22) Filed: Apr. 30, 1999

(51) Int. Cl.[7] .................................................. A47B 97/00
(52) U.S. Cl. .................................. 312/223.2; 312/265.6; 361/801; 361/825; 403/353
(58) Field of Search .............................. 312/223.1, 223.2, 312/7.1, 265.5, 265.6, 293.3; 206/719; 361/725, 726, 686, 683, 801, 800, 802, 684, 825; 211/26, 41.17; 248/27.1, 27.3; 174/35 R, 35 GC, 66, 67

(56) References Cited

U.S. PATENT DOCUMENTS

| | | | |
|---|---|---|---|
| 3,156,282 | * 11/1964 | Bedford, Jr. | 403/353 X |
| 4,555,080 | * 11/1985 | Nara | 248/27.1 |
| 4,971,563 | * 11/1990 | Wells, III | 361/683 X |
| 5,466,059 | * 11/1995 | Liu | 312/223.2 |
| 5,575,546 | * 11/1996 | Radloff | 312/223.1 X |
| 5,579,210 | * 11/1996 | Ruhland et al. | 361/801 X |
| 5,590,023 | * 12/1996 | Hernandez et al. | 361/825 X |
| 5,593,220 | * 1/1997 | Seid et al. | 312/223.2 X |
| 5,601,349 | * 2/1997 | Holt | 312/223.1 X |
| 5,641,309 | * 6/1997 | Carney et al. | 361/801 |
| 5,694,291 | * 12/1997 | Feightner | 361/683 |
| 5,742,003 | * 4/1998 | Ho | 361/825 X |
| 5,947,571 | * 9/1999 | Ho | 312/223.2 X |

* cited by examiner

*Primary Examiner*—Peter M. Cuomo
*Assistant Examiner*—James O. Hansen
(74) *Attorney, Agent, or Firm*—Denise A. Lee

(57) ABSTRACT

The I/O bracket retainer is a unitary structure that provides excellent EMI shielding without the requirement of an additional gasket layer. EMI leakage is minimized by providing an I/O bracket retainer surface. typically stainless steel, that conforms to the surface of the I/O bracket retainer and I/O panel, thus minimizing seams formed due to small differences in the planarities of the I/O bracket retainer and I/O panel. EMI leakage is further reduced by providing firm contact between the surfaces of the I/O bracket retainer and I/O panel to minimize seam formation between these parts. Firm contact is provided in part by a first positioning tab and spring finger which extend from a sidewall of the structure to the front panel of the I/O bracket retainer. The front panel of the I/O bracket retainer is designed for receiving and securing an I/O panel. The I/O panel is positioned between the first spring member and positioning tab of the I/O bracket which helps provide firm contact to the I/O panel.

20 Claims, 7 Drawing Sheets

PCI I/O BRACKET RETAINER

BACKGROUND OF THE INVENTION

The invention relates to mounting of an I/O bracket in a metal chassis of a computer system, and more specifically to a low EMI leakage solution to mounting an I/O bracket. Today's computer systems are required to connect to multiple peripheral devices such as external storage and network devices. Conductive pathways supported by input/output (I/O) panels in the computer chassis provide a means through which the input and output signals of the components in the chassis of the computer can communicate with peripheral devices external to the chassis.

Referring to FIGS. 1A and 1B show a partial view of a metal chassis 110 before insertion of an I/O panel 112 or I/O bracket 112 into the I/O frame 114 of the metal chassis 110. Typically for each I/O card, there is a corresponding opening in the rear of the metal chassis. It is well known that electronic components housed in the computer chassis are capable of emitting electromagnetic radiation and standards have been established for limiting such emissions. Openings in the metal chassis and leakage resulting from seams formed between two metal surfaces in the chassis can present particularly difficult problems with respect to such electromagnetic radiation.

Designs are typically made to minimize openings in the metal chassis and leakage due to seams. In the embodiment shown in FIG. 1A the openings 116 in the I/O frame are closed and the I/O panel 112 is secured to the I/O frame 114 by screwing the I/O panel 112 to the I/O frame 114. Although the implementation and assembly required by screwing the I/O panel to the I/O frame is simple, typically it does not provide a good EMI seal and the EMI rating of the closure required by FIG. 1A is not acceptable for all applications. The problem with the closure required by FIG. 1A, is that the differences in planarity between the metal I/O bracket retainer 118, the I/O frame 114 and the metal I/O panel 112 typically causes a seam to form along the edges of the I/O panel, resulting in EMI leakage. The solution of precisely machining the planarity of the parts so that no EMI leakage occurs is cost prohibitive. An alternative solution is to add a gasket between the metal I/O bracket retainer and the metal I/O panel.

In a second alternative embodiment, a gasketing layer 120 is positioned between the I/O bracket retainer 118 and the I/O panel of the metal chassis. FIG. 1B shows a partial view of a metal computer chassis before insertion of the gasketing layer 120 and I/O panel 112 into the I/O frame 114. Although the metal chassis 110 is typically comprised of sheet metal, typically the gasketing layer 120 shown in FIG. 1B is comprised of a stainless steel material. Conventionally the gasketing layer 120 is a thin layer of stainless steel, that typically has a thickness in the range of 0.15 to 0.3 mm. The gasketing layer 120 is typically dimpled so that it is non-planar and conforms to the surfaces of the I/O bracket retainer 118 and the I/O panel 112. The gasketing layer 120 helps to eliminate any differences in planarity between the surface of the I/O bracket retainer 118 and I/O panel 112 by rubbing against the surfaces of the I/O bracket retainer and I/O panel sheet metal to ensure good contact is made, thus helping to eliminate any seams where EMI radiation leakage could occur.

Although the embodiment shown in FIG. 1B helps prevent EMI leakage, the configuration is more difficult to assemble than the embodiment shown in FIG. 1A. The gasket layering 120 must be carefully aligned so that the openings 116 of the I/O frame 114 coincide with the openings of the I/O panel and further that the screw hole for the gasketing layer are aligned to the corresponding screw holes of the I/O bracket and I/O frame. A further concern with related to the embodiment shown in FIG. 1B is design flexibility. Gasketing layers may need to be customized to fit a non-standard I/O opening potentially increasing computer system costs.

An I/O bracket retainer which is easy to assemble, takes minimal space and which provides design flexibility and excellent EMI shielding is needed.

SUMMARY OF THE INVENTION

The present invention provides an I/O bracket retainer which is easy to assemble, takes minimal space and which provides design flexibility and excellent EMI shielding. The I/O bracket retainer is preferably a rectangular structure that includes first, second, third and fourth sidewalls, wherein the first sidewall is opposite to the second sidewall and the third sidewall is opposite to the four sidewall. A front panel or section of the I/O bracket retainer is preferably positioned to be generally orthogonal to the first, second, third and fourth sidewalls of the I/O bracket retainer structure. The front panel of the I/O bracket retainer is designed for receiving and securing an I/O panel and includes an opening for receiving the I/O panel. The back panel of the I/O bracket retainer, opposite to the front panel of the I/O panel, is preferably left open to facilitate electrical connection from peripheral devices to the I/O panel.

The I/O bracket retainer of the present invention is preferably a unitary structure that provides excellent EMI shielding without the requirement of an additional gasket layer. EMI leakage is minimized by providing an I/O bracket retainer surface that conforms to the surface of the I/O bracket retainer and I/O panel, thus minimizing seams formed due to small differences in the planarities of the I/O bracket retainer and I/O panel. EMI leakage is further reduced by providing firm contact between the surfaces of the I/O bracket retainer and I/O panel to minimize seam formation between these parts.

In the preferred embodiment of the present invention, the I/O bracket retainer includes at least a first positioning tab and at least a first spring finger. The positioning tab and spring finger typically extend from a sidewall of the rectangular structure to the front panel of the I/O bracket retainer. Securing the position of the I/O panel so that it is fixed to prevent motion in the direction towards the back of the I/O bracket is performed primarily by the combination of the spring fingers and the positioning tabs. The I/O panel is typically slid into position so that it is sandwiched or positioned between the first spring member and the positioning tab of the I/O bracket. The spring finger provides an inward force directed towards the back of the I/O bracket opening and thus the metal chassis, while the positioning tab prevents the I/O panel movement from further movement in the direction towards the back of the I/O bracket retainer.

In the preferred embodiment, the I/O bracket retainer includes an I/O frame tab extending from a first sidewall of the I/O bracket retainer and a chassis attachment tab extending from a second sidewall of the I/O bracket retainer, The I/O frame tab fits into an opening on the I/O frame of the metal chassis while the chassis attachment tab is attached to the I/O frame of the metal chassis, typically using a rivet. The combination of the I/O frame tab and chassis attachment tab secures the I/O panel in the plane generally parallel to the front face of the I/O bracket retainer while the combination of the spring finger member and positioning tab prevent movement of the I/O panel in the direction towards the back opening of the I/O bracket retainer. The combination of these elements of I/O bracket retainer acts to provide firm contact and secure positioning between the surfaces of the I/O bracket retainer, I/O panel and the metal chassis to minimize seam formation between these parts.

The I/O bracket retainer is designed to be attached to a metal chassis and I/O panel that are both comprised of a sheet metal material, a material that has limited deformation qualities. The I/O bracket retainer is preferably formed from stainless steel material that will deflect or bend, yet will not set or permanently deform for the force typically applied to the I/O bracket retainer or I/O panel. This allows the spring fingers of the I/O bracket retainer to conform their position to accommodate for minor differences in planarity between the I/O bracket retainer and the I/O panel. Thus reducing precise machining requirements for the I/O bracket retainer and I/O panel and thus costs associated with manufacturing of the I/O panel.

Further, because no gasketing layer is required, the present invention offers improved design flexibility. In the present invention, no custom gasket would be required which potentially reduces system costs.

A further understanding of the nature and advantages of the present invention may be realized with reference to the remaining portions of the specifications and the attached drawings.

DETAILED DESCRIPTION OF THE PREFERRED EMBODIMENTS

Figure 1A:
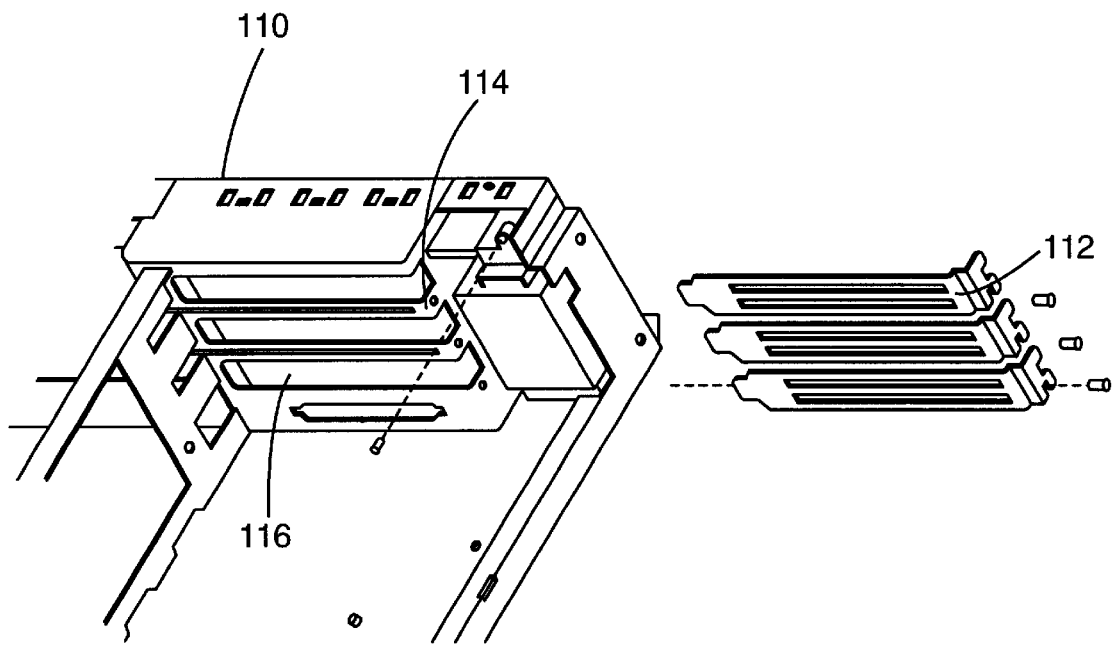
FIG. 1A shows a partial of a metal computer chassis before insertion of the I/O bracket into the I/O frame.
Figure 1B:
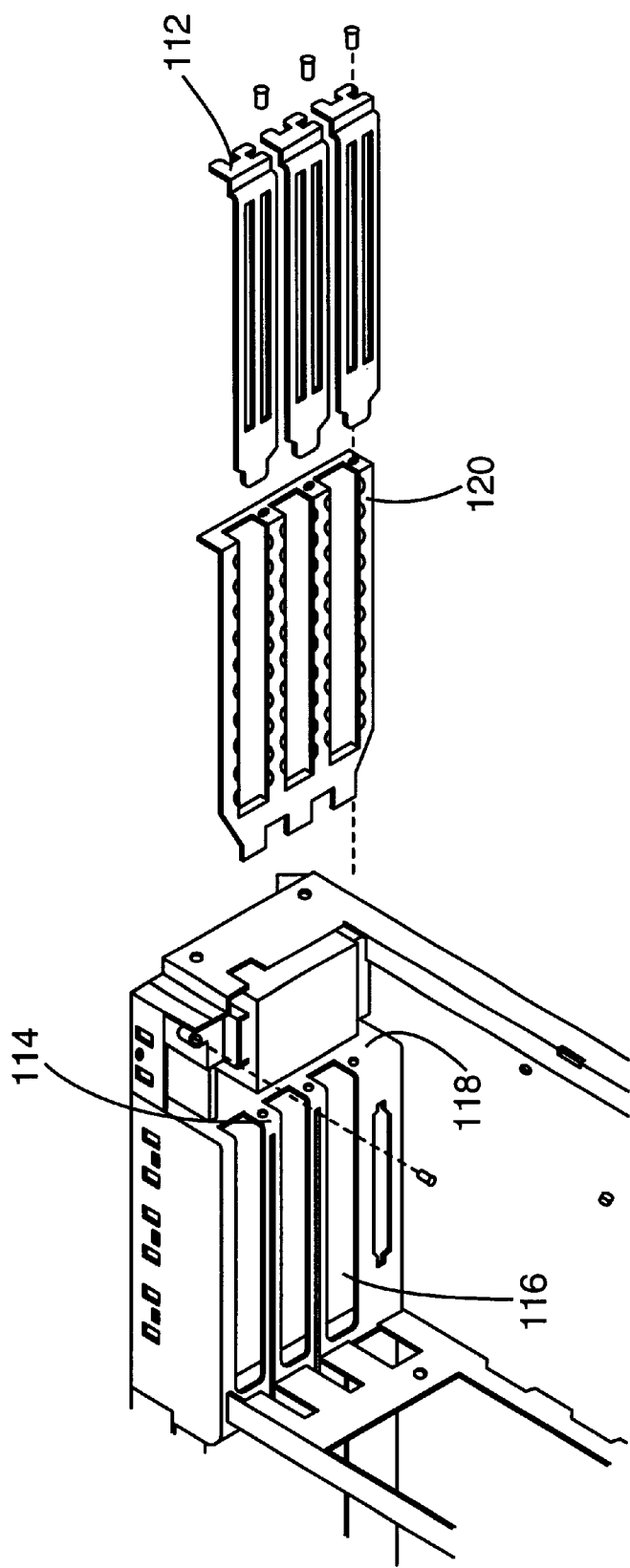
FIG. 1B shows a partial of a metal computer chassis before insertion of the gasket and I/O bracket into the I/O frame.
Figure 2A:
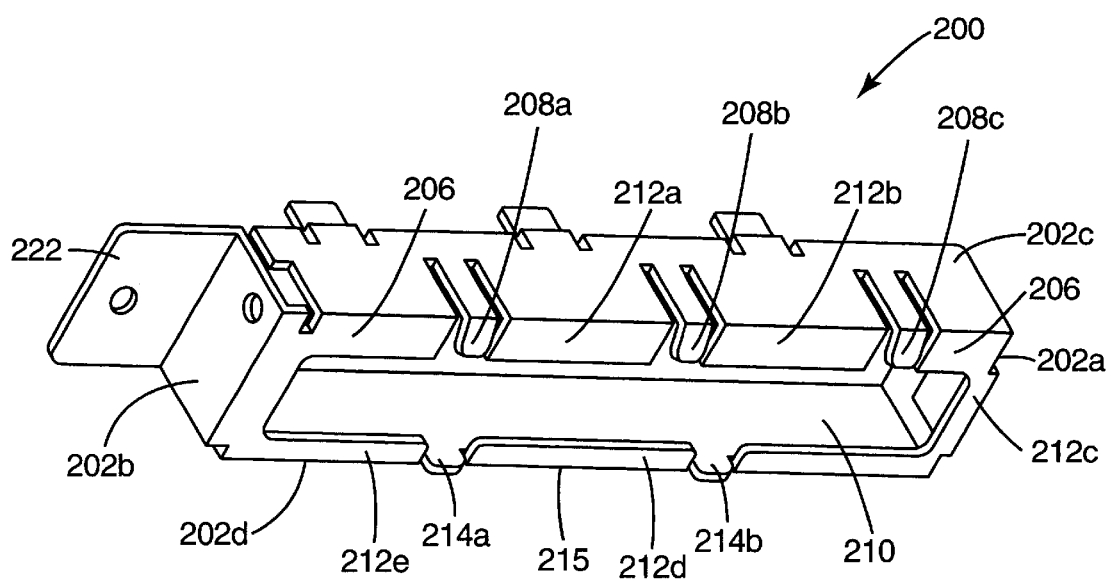
FIG. 2A shows an isometric view of the I/O bracket retainer according to the preferred embodiment of the present invention.

FIG. 2A shows an isometric view of an I/O bracket retainer 200 according to the preferred embodiment of the present invention. Referring to FIG. 2A, the I/O bracket retainer 200 is preferably a rectangular structure that includes a first 202a, second 202b, third 202c and fourth 202d sidewalls, wherein the first sidewall 202a is opposite to the second sidewall 202b and the third sidewall 202c is opposite to the fourth sidewall 202d. In the preferred embodiment, the dimensions of the I/O bracket are designed to meet the requirements of the PCI computer system standard, a standard well known in art. Specifically, the length of the first and second sidewalls is approximately 101 mm, while the length of the third and fourth sidewalls is approximately 23 mm.

Figure 2B:
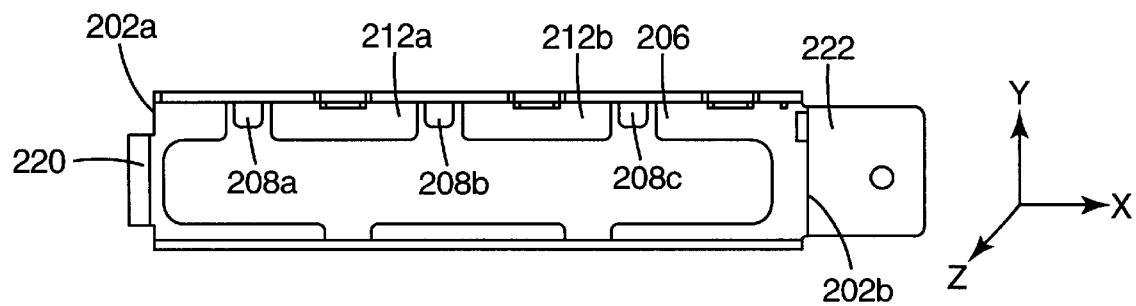
FIG. 2B show a front view of the I/O bracket retainer shown in FIG. 2A.

FIG. 2B shows a front view of the I/O bracket retainer shown in FIG. 2A. Referring to FIGS. 2A and 2B, the I/O bracket typically includes a front panel section 206. Excluding the spring fingers 208a–c which are angled with respect to the front panel section and the support tabs 214a–b, the front panel section 206 is preferably positioned to be generally orthogonal to the first, second, third and fourth sidewalls 202a–d of the I/O bracket retainer structure. The front panel section 206 of the I/O bracket retainer is designed for receiving and securing an I/O panel and includes an opening 210 for receiving the I/O panel. FIG. 2C shows a back view of the I/O bracket retainer. The back of the I/O bracket retainer, opposite to the front panel of the I/O panel, is preferably left open to facilitate electrical connection from peripheral devices to the I/O panel.

Referring to FIGS. 2A and 2B the I/O bracket retainer includes at least a first positioning tab 212a and at least a first spring finger 208a. The first positioning tab and first spring finger help to secure the I/O panel in the direction towards the back of the I/O bracket (the z direction). Although the number of positioning tabs 212a–b and spring fingers 208a–c can vary, in the preferred embodiment at least two positioning tabs 212a–b and three spring fingers 208a–c are used to help secure and provide firm contact to the I/O panel. The positioning tabs 212a–b and spring fingers 208a–c typically extend from a sidewall 202c of the rectangular structure to the front panel of the I/O bracket retainer.

In addition to the positioning tabs 212a–b and the spring fingers 208a–c, the front panel of the I/O bracket retainer also typically includes a pair of support tabs 214a, 214b extending from the bottom edge 215 of the I/O bracket retainer. The support tabs aide in securing the I/O panel by providing further support for the I/O panel. Typically the support tabs 214a–b extend from the fourth sidewall of the structure and are generally orthogonal to the positioning tabs 212c–e. In addition the support tabs helps align the I/O panel into the I/O bracket retainer when the I/O panel is being inserted into the I/O bracket retainer.

In the preferred embodiment, the support tabs 214a–b extend from the fourth (bottom) sidewall 202d, however in an alternative embodiment, the support tabs 214a–b could extend from the first (top) sidewall. Further in an alternative embodiment, a spring finger member or a positioning tab could extend from the bottom (fourth) sidewall, or alternatively from the second or third sidewalls in addition to or to replace those already shown extending from the top (third) sidewall.

In the preferred embodiment, the I/O bracket retainer 200 includes an I/O frame tab 220 extending from a first sidewall 202a of the I/O bracket retainer and a chassis attachment tab 222 extending from a second sidewall 202b of the I/O bracket retainer. The I/O frame tab 220 fits into an opening on the I/O frame of the metal chassis while the chassis attachment tab is attached to the I/O frame of the metal chassis, typically using a rivet.

Figure 2D:
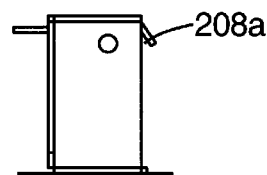
FIG. 2D shows a side view of the I/O bracket retainer shown in FIG. 2A.
Figure 2C:
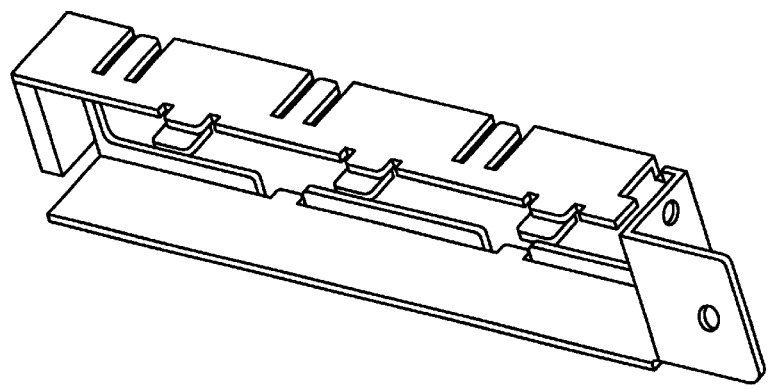
FIG. 2C shows a back view of the I/O bracket retainer shown in FIG. 2A.

FIG. 2D shows a side view of the I/O bracket retainer shown in FIG. 2A. FIGS. 2A and 2D show that preferably the spring fingers are angled with respect to the primary surface of the front panel of the I/O bracket. In the preferred embodiment, the angle between the primary surface of the front panel of the I/O bracket and the spring finger is approximately 29 degrees.

The I/O bracket retainer of the present invention is preferably a unitary structure that provides excellent EMI shielding without the requirement of an additional gasket layer. EMI leakage is minimized by providing an I/O bracket retainer surface that conforms to the surface of the I/O bracket retainer and I/O panel, thus minimizing seams formed due to small differences in the planarities of the I/O bracket retainer and I/O panel. These small differences in planaraities between the surfaces of the I/O bracket and I/O panel leads to openings between the two surfaces through which EMI radiation can leak.

The I/O bracket retainer is designed to be attached to a metal chassis and I/O panel that are both comprised of a sheet metal material, a material that has limited deformation qualities. The I/O bracket retainer is preferably formed from stainless steel material. 301/303 Stainless Steel, ¼ hard has been found to work well. The material characteristics of stainless steel allows the spring fingers of the I/O bracket retainer to bend or conform their position to accommodate for minor differences in planarity between the I/O bracket retainer and the I/O panel. Although other materials may be used, stainless steel has the property that will deflect or bend allowing it to conform to a surface when a force is applied. Yet, the same applied force will not set or permanently deform the I/O bracket retainer or I/O panel.

Figure 3:
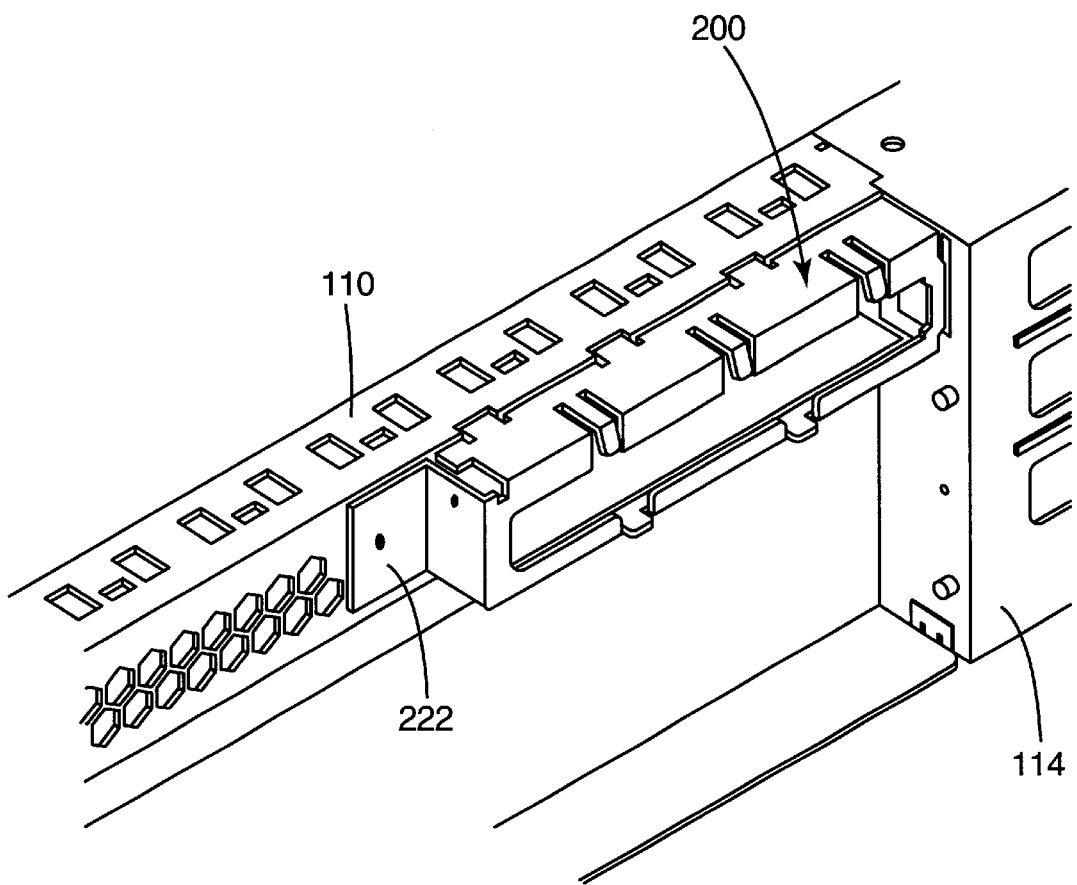
FIG. 3 shows an isometric view of the I/O bracket retainer inserted into an I/O frame.
Figure 4:
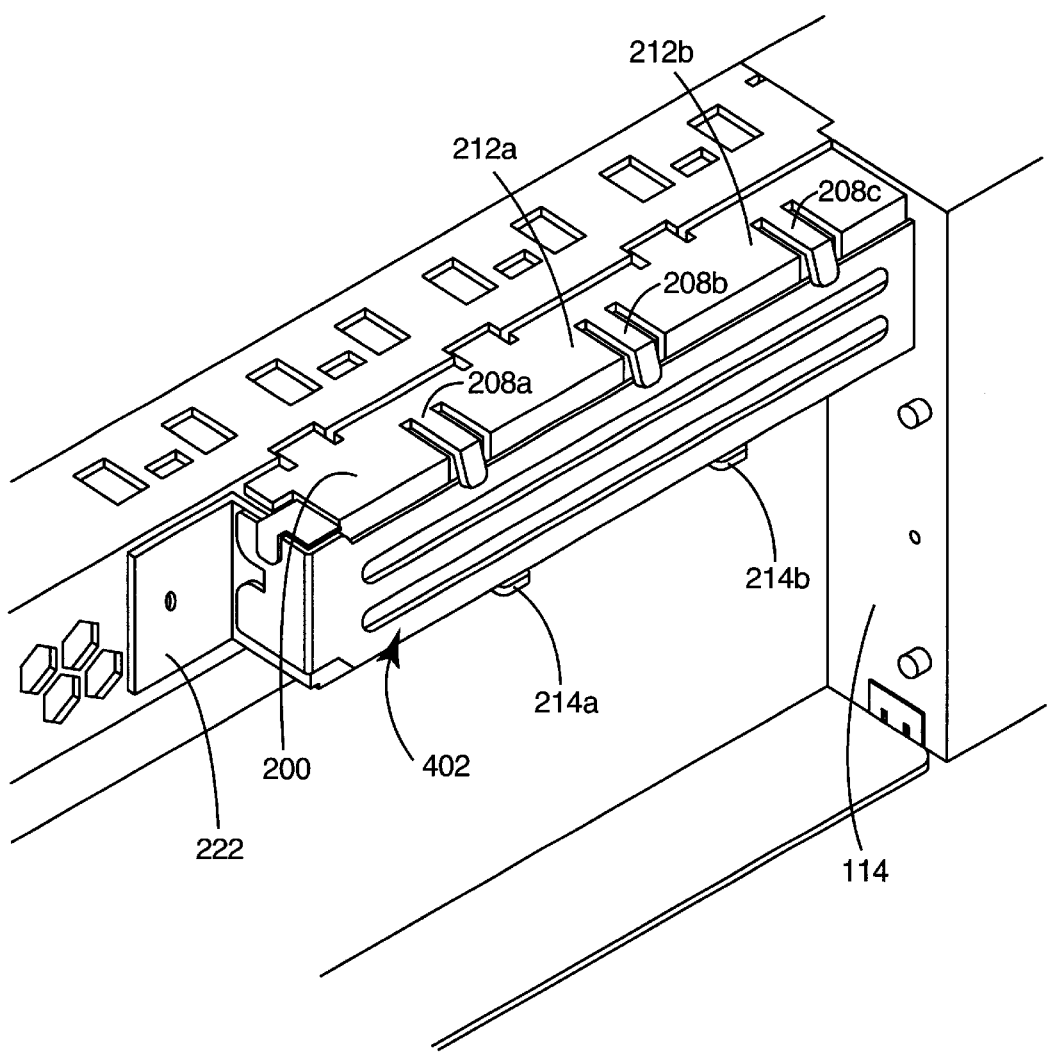
FIG. 4 shows an isometric view of the I/O bracket retainer after insertion into an I/O frame and after insertion of the I/O bracket panel.

FIG. 3 shows an isometric view of the I/O bracket retainer according to the present invention inserted into an I/O frame. FIG. 4 shows an isometric view of the I/O bracket retainer according to the present invention after insertion of an I/O panel 402 into the I/O bracket retainer according to the present invention. For illustrative purposes, the I/O panel is blank. However, in many applications the I/O panel is not blank but will provide support and shielding for a plurality of interface cables to peripheral devices that enter and exit the metal chassis enclosure.

EMI leakage is further reduced by providing firm contact between the surfaces of the I/O bracket retainer 200 and I/O panel 402 to minimize seam formation between these parts. Securing the position of the I/O panel so that it is fixed to prevent motion in the direction towards the back of the I/O bracket is performed primarily by the combination of the spring fingers 208a–c and the positioning tabs 212a–b. The I/O panel 402 is typically slid into position so that it is sandwiched or positioned between the spring fingers and the positioning tab of the I/O bracket. After insertion between the spring fingers and the positioning tab (by pushing upwards), the I/O panel is pushed towards the I/O bracket retainer so that it rests on the support tabs 214a–b. The spring fingers 208a–c provides an inward force directed towards the back of the I/O bracket opening and thus the metal chassis, while the positioning tabs 212a–e prevent the I/O panel movement from further movement in the direction towards the back of the I/O bracket retainer (the z direction).

Figure 5:
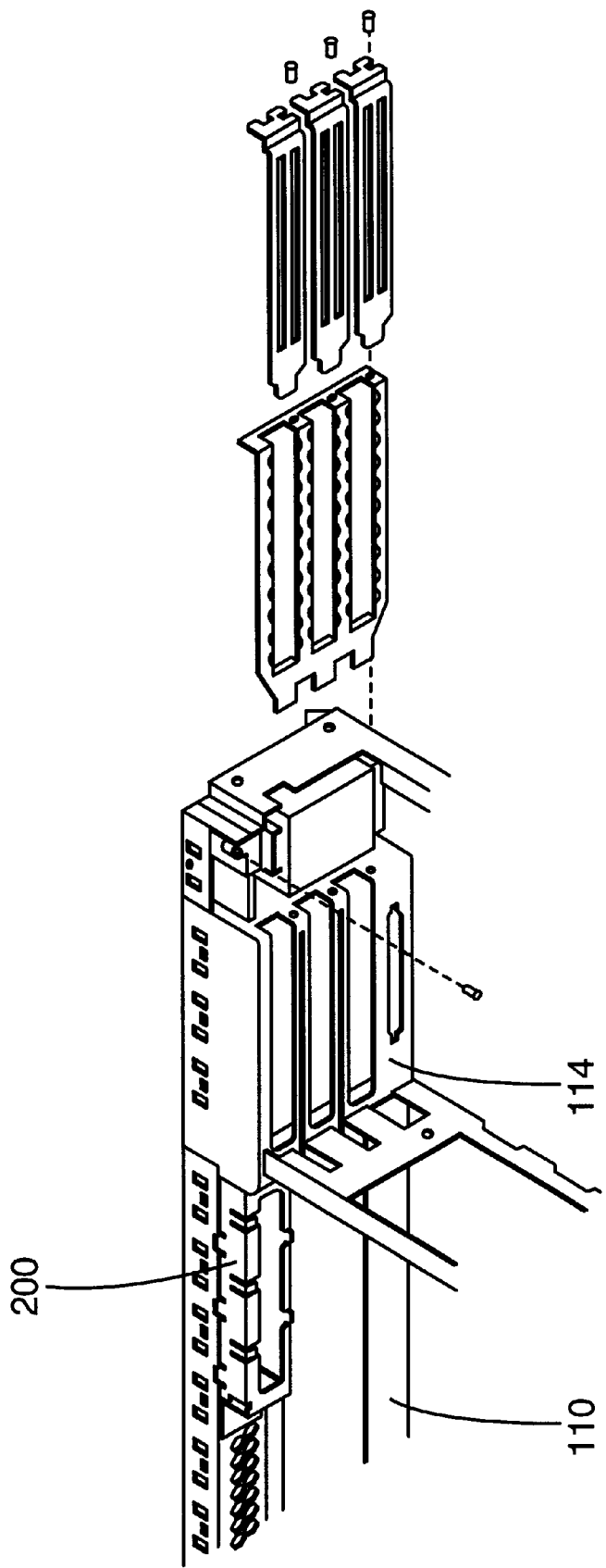
FIG. 5 shows a view of the I/O bracket retainer according to the preferred embodiment of the present invention installed in a metal chassis adjacent to a conventional I/O frame.

FIG. 5 shows a view of the I/O bracket retainer 200 according to the preferred embodiment of the present invention installed in a metal chassis I/O adjacent to a conventional I/O frame 114. The I/O frame tab fits into an opening on the I/O frame of the metal chassis while the chassis attachment tab is attached to the I/O frame of the metal chassis, typically using a rivet. The combination of the I/O frame tab and chassis attachment tab secures the I/O panel in the plane generally parallel to the front face of the I/O bracket retainer (the xy direction) while the combination of the spring finger member and positioning tab prevent movement of the I/O panel in the direction towards the back opening of the I/O bracket retainer (the z direction). The combination of these elements of I/O bracket retainer acts to provide firm contact and secure positioning between the surfaces of the I/O bracket retainer, the I/O panel and the metal chassis to minimize seam formation between these parts.

It is understood that the above description is intended to be illustrative and not restrictive. For example, the number of support tabs in the front panel of the I/O bracket retainer may vary. The scope of the invention should therefore be determined with reference to the appended claims, along with the full scope of the equivalents to which such claims are entitled.

What is claimed is:

1. An I/O bracket retainer, comprising:
a structure including a first sidewall and a front panel region that includes at least one spring finger and at least one positioning tab, wherein, except for the at least one spring finger, the front panel region is substantially orthogonal to the first sidewall, wherein the at least one spring finger and the at least one positioning tab each extend from the first sidewall, wherein a portion of the at least one spring finger is in a plane of the first sidewall, wherein the front panel region has a primary surface and an opening defined therein, wherein the at least one spring finger projects beyond and is bent towards the primary surface, and wherein a portion of the primary surface constitutes a surface of the at least one positioning tab.

2. The I/O bracket retainer of claim 1, wherein the structure is a rectangular structure including the first sidewall, a second sidewall, a third sidewall and a fourth sidewall, wherein the first sidewall is opposite to the second sidewall and the third sidewall is opposite to the fourth sidewall.

3. The I/O bracket retainer of claim 2, wherein the front panel region of the structure is also substantially orthogonal to the second, third and fourth sidewalls of the rectangular structure.

4. The I/O bracket retainer of claim 2, wherein an I/O frame tab extends from the third sidewall of the rectangular structure.

5. The I/O bracket retainer of claim 2, wherein a chassis attachment tab extends from the second sidewall of the rectangular structure.

6. The I/O bracket retainer of claim 1, wherein the structure is formed of a material which deforms at a predetermined location for a predetermined applied force, wherein the material does not set at the predetermined applied force.

7. The I/O bracket retainer of claim 6, wherein the material is stainless steel.

8. The I/O bracket retainer of claim 1, wherein an end of the at least one spring finger is oriented at an acute angle with respect to a plane of the primary surface of the front panel region.

9. The I/O bracket retainer of claim 1, wherein the structure is adapted to receive and secure an I/O panel.

10. An I/O panel attachment system, comprising:
an I/O bracket retainer including a first sidewall and a front panel region that includes at least one spring finger and at least one positioning tab, wherein, except for the at least one spring finger, the front panel region is substantially orthogonal to the first sidewall, wherein the at least one spring finger and the at least one positioning tab each extend from the first sidewall, wherein a portion of the at least one spring finger is in a plane of the first sidewall; and an I/O panel inserted into the I/O bracket retainer, wherein an edge of the I/O panel is positioned between the at least one spring finger and the at least one positioning tab.

11. The I/O panel attachment system of claim 10, wherein the I/O bracket retainer has a surface formed of a material which conforms to a surface of the I/O panel when a predetermined force is applied to the I/O bracket retainer by the I/O panel, wherein the material does not set at the predetermined force.

12. The I/O panel attachment system of claim 11, wherein the material is stainless steel.

13. The I/O panel attachment system of claim 10, wherein the front panel region of the I/O bracket retainer has an opening defined therein, and wherein the I/O panel covers the opening.

14. The I/O panel attachment system of claim 10, wherein an end of the at least one spring finger is positioned on a first side of the I/O panel, and wherein the at least one positioning tab is positioned on a second side of the I/O panel opposite the first side.

15. The I/O panel attachment system of claim 14, wherein the front panel region of the I/O bracket retainer has a primary surface, and wherein the second side of the I/O panel has a surface which contacts the primary surface.

16. The I/O panel attachment system of claim 15, wherein the at least one spring finger is biased towards the primary surface so as to provide an inward force directed towards the primary surface.

17. A method of shielding electromagnetic radiation from a computer system including a chassis, the method comprising the steps of:

providing an I/O bracket retainer including a first sidewall and a front panel region that includes at least one spring finger and at least one positioning tab, wherein, except for the at least one spring finger, the front panel region is substantially orthogonal to the first sidewall, wherein the at least one spring finger and the at least one positioning tab each extend from the first sidewall;

attaching the I/O bracket retainer to the chassis of the computer system; and inserting an I/O panel into the I/O bracket retainer, wherein the step of inserting the I/O panel into the I/O bracket retainer includes inserting a first edge of the I/O panel between the at least one spring finger and the at least one positioning tab.

18. The method of claim 17, wherein the I/O bracket retainer includes at least one support tab opposite the at least one spring finger, and further comprising the step of:

resting a second edge of the I/O panel, opposite the first edge, on the at least one support tab.

19. The method of claim 17, wherein the front panel region of the I/O bracket retainer has an opening defined therein, and further comprising the step of:

covering the opening of the front panel region with the I/O panel.

20. The method of claim 17, further comprising the steps of:

applying force to a first side of the I/O panel with the at least one spring finger; and applying force to a second side of the I/O panel, opposite the first side, with the at least one positioning tab.

* * * * *